United States Patent [19]
Moscicki

[11] Patent Number: 5,675,182
[45] Date of Patent: Oct. 7, 1997

[54] HEAT SINK FOR PLASTIC CASINGS

[75] Inventor: Jean-Pierre Moscicki, Saint Egreve, France

[73] Assignee: SGS-Thomson Microelectronics S.A., Saint Genis, France

[21] Appl. No.: 286,998

[22] Filed: Aug. 8, 1994

[30] Foreign Application Priority Data

Aug. 9, 1993 [FR] France .................. 93 09931

[51] Int. Cl.⁶ .................. H01L 23/34; H01L 23/28
[52] U.S. Cl. .................. 257/722; 257/796; 165/80.3; 361/709; 361/717
[58] Field of Search .................. 257/722, 796, 257/675; 165/80.2, 80.3; 361/697, 709, 717, 718, 723

[56] References Cited

U.S. PATENT DOCUMENTS

| | | | |
|---|---|---|---|
| 3,617,980 | 11/1971 | Alkire et al. | 257/722 |
| 3,670,215 | 6/1972 | Wilkens et al. | 257/722 |
| 3,694,703 | 9/1972 | Wilens et al. | 165/80.3 |
| 3,893,161 | 7/1975 | Pesak, Jr. | 257/722 |
| 4,041,524 | 8/1977 | Trunk et al. | 257/722 |
| 4,215,361 | 7/1980 | McCarthy | 257/722 |
| 4,541,005 | 9/1985 | Hunter et al. | 257/796 |
| 4,675,718 | 6/1987 | Tsubokura et al. | 165/80.2 |
| 4,945,401 | 7/1990 | Trunk et al. | 257/722 |
| 5,019,942 | 5/1991 | Clemens | 165/80.3 |
| 5,311,395 | 5/1994 | McGaha et al. | 257/722 |

OTHER PUBLICATIONS

Patent Abstracts of Japan, vol. 008, No. 074 (E–236), Apr. 6, 1984 & JP-A-58 223 353.
Patent Abstracts of Japan, vol. 013, No. 235 (E–766), May 30, 1989 & JP-A-01 041 253.
Patent Abstracts of Japan, vol. 013, 544 (E–855) Dec. 6, 1989 & JP-A-01 225 190.

*Primary Examiner*—Tom Thomas
*Assistant Examiner*—David Ostrowski
*Attorney, Agent, or Firm*—Wolf, Greenfield & Sacks, P.C.; James H. Morris

[57] ABSTRACT

A heat sink for mounting a semiconductor chip in a plastic casing. The upper surface of the heat sink is in thermal contact with the semiconductor chip, the lower surface is coplanar with a main surface of the casing. The heat sink is formed from a substantially square sheet of metal having each of its corners folded as a tongue to provide a substantially square base, each of the folded tongues forming the lower surface of the base.

32 Claims, 4 Drawing Sheets

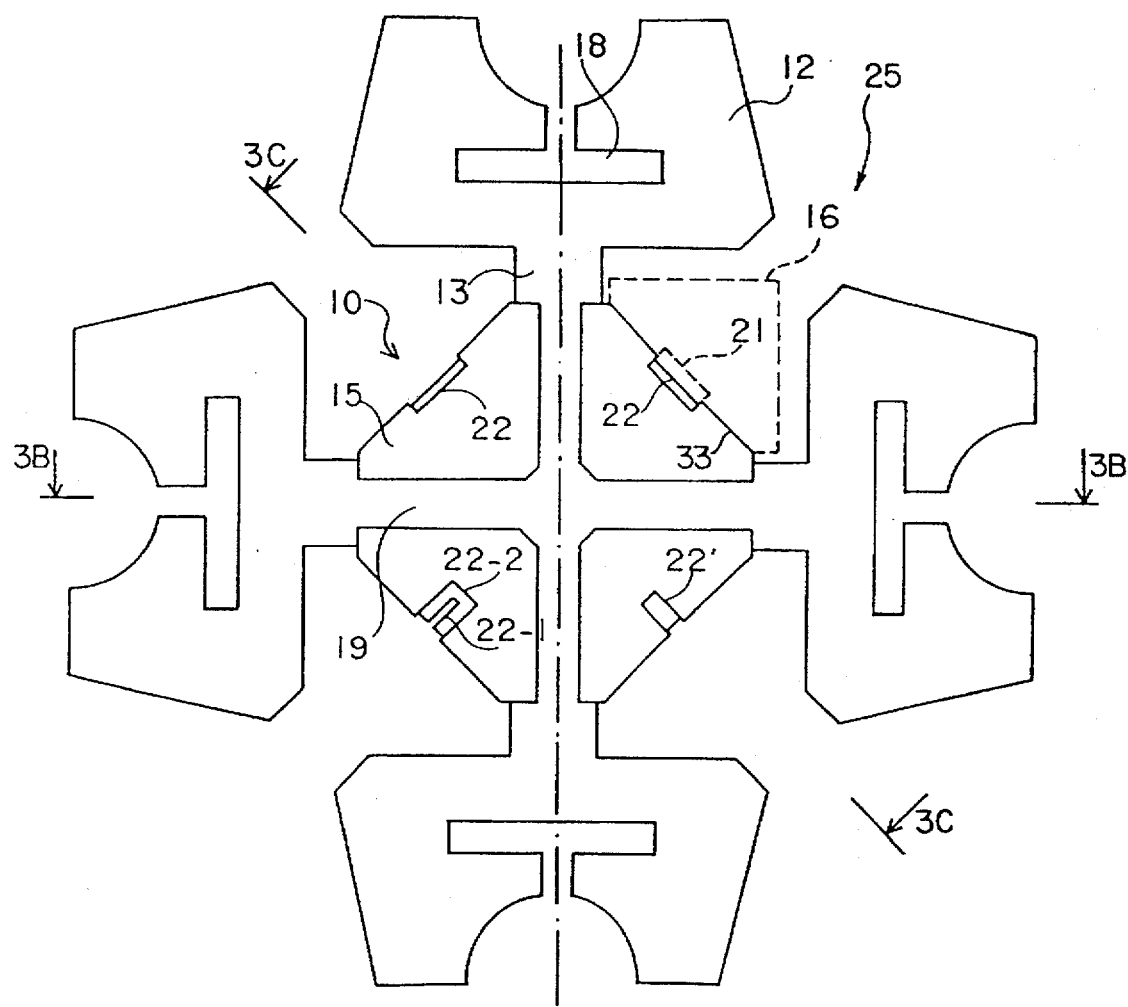
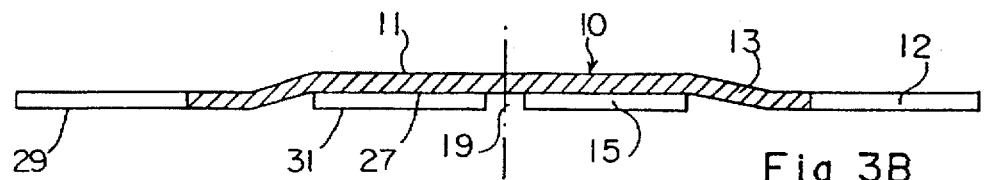
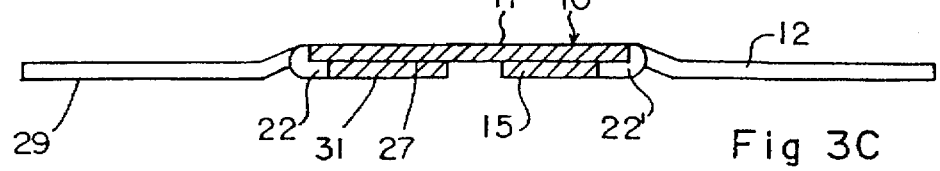
Fig 3A
Fig 3B
Fig 3C

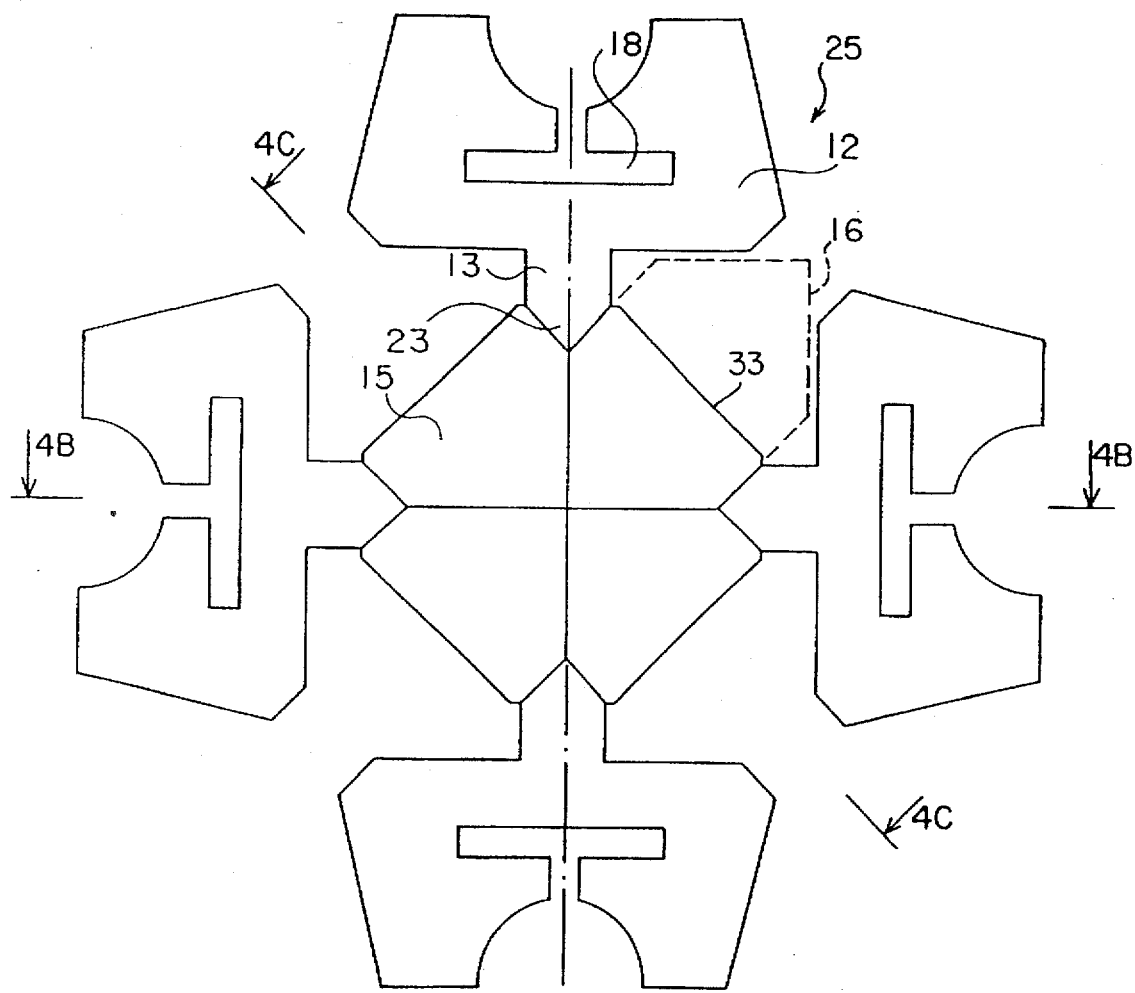
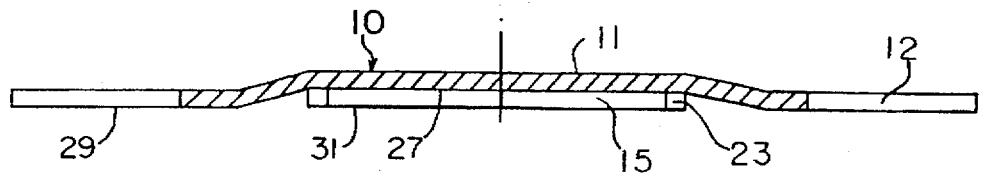
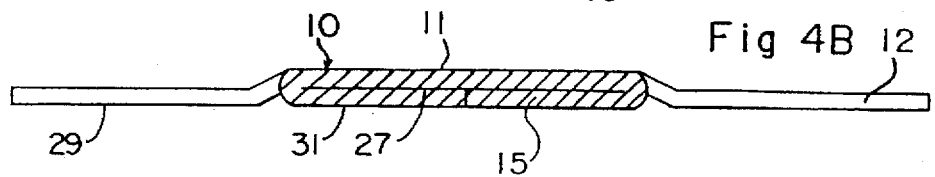
Fig 4A
Fig 4B
Fig 4C

HEAT SINK FOR PLASTIC CASINGS

BACKGROUND OF THE INVENTION

1. Field of the Invention

The present invention relates to semiconductor component casings, and more particularly to multi-pin casings for integrated circuits formed by molding a thermosetting plastic material.

2. Discussion of the Related Art

The power that can be dissipated by integrated circuits increases (with an increased density of circuits on silicon chips). Typically, the power dissipation of integrated circuits has often been considered as negligible. However, modern integrated circuits can now dissipate power of the same order of magnitude as discrete components, for example approximately 10 watts. A problem associated with this increased power dissipation arises with the heat-conductive, thermosetting plastic coating, such as a silicon epoxy resin, applied to the entire surface of a silicon chip which can no longer ensure the required thermal dissipation.

Component casings, such as the one illustrated in the cross-sectional view of FIG. 1, have been proposed to address this problem. This casing 7, designed to provide protection for and connection of an integrated circuit chip, includes a chip 1 disposed on a chip support portion 2 of a lead frame that also includes connecting pins 3. Each connecting pin 3 is connected to a pad of the chip 1 through a conductive wire 4. Conventionally, mounting the chip 1 to the support 2 is achieved with a layer of heat conductive adhesive 5. The chip 1 and support 2 assembly are molded into a thermosetting resin in a manner that allows the pins 3 to protrude externally from the casing 7. The casing 7 is often shaped as a square or rectangle and includes pins on each of the four sides. Typically, the casing is a few centimeters in sides and has a standard 3.6-mm height. It is often referred to in the art as a "Plastic Quad Flat Pack" (PQFP). In addition, when the chip dissipates a relatively high power, a heat sink base 8 is added, on which support 2 is placed, and which extends down to the lower main surface of the casing. The base 8 may include, for example, fins 9 as shown in FIG. 1. This base 8 is generally made from a metal, usually copper or aluminum.

Conventionally, the base 8, which can have a 1 to 2-mm thickness, is press-manufactured which, more particularly when made of aluminum, requires a complex and expensive manufacturing process. Another problem associated with such a casing is that, after injection of resin into a mold, upon hardening, its contraction ratio during the polymerization step is much higher than the thermal contraction of silicon and of the various metals, more particularly of the material of the base. As a result, the casing 7 may be distorted and warped, and become concave near its upper surface where the resin is thicker. This deformation can produce various defects, including defective anchoring between the resin and the elements it contains, to such an extent that it can result in damage to the silicon chip.

SUMMARY OF THE INVENTION

Thus, an object of the present invention is to provide a particular structure for the heat sink base that solves both the manufacturing and deformation problems.

This and other objects are achieved according to the invention with a heat sink for use in a plastic semiconductor casing that includes a base, an upper surface of the base being in thermal contact with a semiconductor chip, and a lower surface being coplanar with a main surface of the casing. The base is formed from a sheet of metal provided with cuts, each of the cuts being folded under the area corresponding to the upper surface of the base to form the lower surface.

According to an embodiment of the invention, the base is formed from a substantially square sheet having each of its corners folded as a tongue to provide a substantially square base, each folded tongue forming the lower surface of the base.

According to an embodiment of the invention, the base includes a platform, and a plurality of fins that are coupled thereto by connecting arms.

According to an embodiment of the invention, each connecting arm is curved so that the lower surface of each fin is coplanar with the lower surface of the platform.

According to an embodiment of the invention, the connecting arms of the fins substantially extend from the central portions of the platform sides before the tongues are folded.

According to an embodiment of the invention, the tongues are folded so that they do not contact each other.

According to an embodiment of the invention, the folded tongues do not contact each other at least near the corners of the substantially square base, so that the upper surface at least partially extends beyond the lower surface.

According to an embodiment of the invention, the sheet of metal, prior to folding, includes apertures near the fold lines, and at least on the tongues.

According to an embodiment of the invention, the base is formed from a sheet of aluminum.

The foregoing and other objects, features, aspects and advantages of the invention will become apparent from the following detailed description of the present invention when taken in conjunction with the accompanying drawings.

BRIEF DESCRIPTION OF DRAWINGS

FIGS. 3A, 3B and 3C illustrate an alternative embodiment of the heat sink base according to the invention; and FIGS. 4A, 4B and 4C illustrate another alternative embodiment of the heat sink base according to the invention.

DETAILED DESCRIPTION

Figure 1:
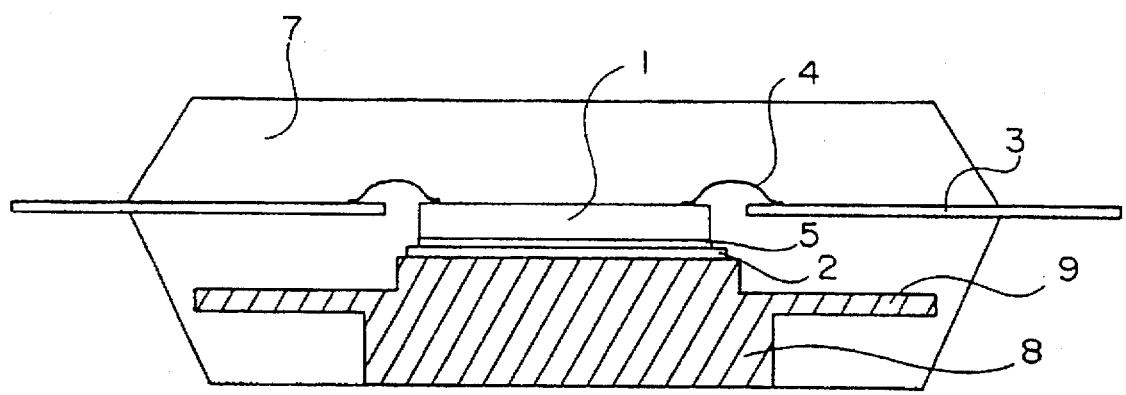
FIG. 1, described above, is a schematic cross-sectional view of a plastic casing with a heat sink.
Figure 2A:
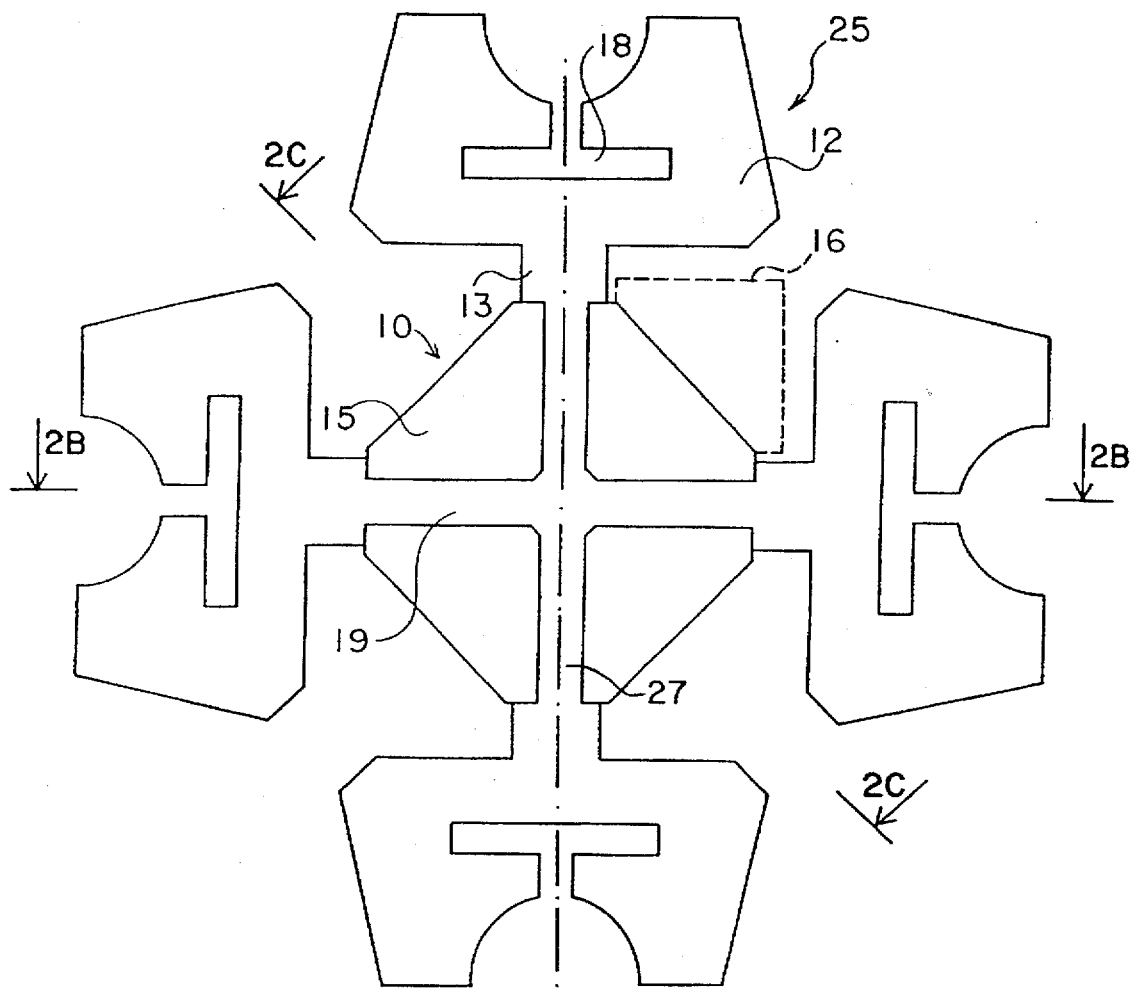
FIG. 2A is a bottom view of a heat sink base according to an embodiment of the invention.
Figure 2B:
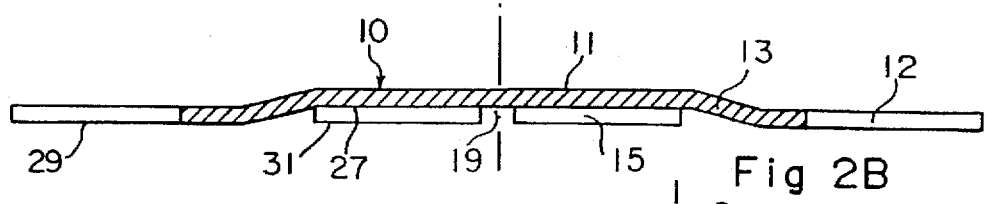
FIG. 2B is a cross-sectional view along line 2B—2B of FIG. 2A.
Figure 2C:
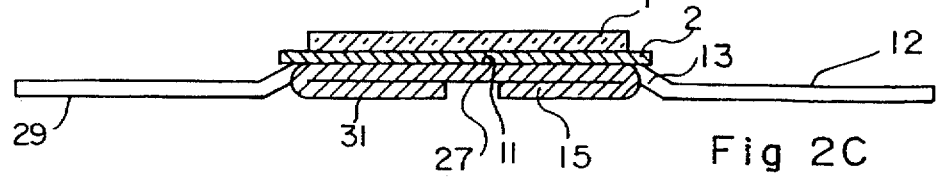
FIG. 2C is a cross-sectional view along line 2C—2C of FIG. 2A.

As shown by the bottom view of FIG. 2A and the cross-sectional views of FIGS. 2B and 2C, the heat sink 25 according to an embodiment of this invention includes a platform 10, fins 12 and connecting arms 13 that connect the fins 12 to the platform 10. The platform 10 is generally square shaped for receiving the chip support 2, shown in FIG. 1, on the upper surface 11 located opposite to the lower surface 27 shown in FIG. 2A. An assembly of the platform 10, the chip support 2, and the chip 1 is illustrated in FIG. 2C. The chip 1 may also be placed directly on the platform 10.

The heat sink 25 is manufactured from a suitably cut sheet of metal having, for example, a 0.8-mm thickness. The center of the heat sink is initially cut in the form of a square, with each corner of this square constituting a tongue 15 that is folded down onto the lower surface 27 of the sheet, as shown in FIGS. 2A–2C. The pattern of a tongue 15 before being folded is shown in phantom and designated as 16 in FIG. 2A. As shown in FIGS. 2B and 2C, the connecting arms 13 between the platform 10 and fins 12 are preferably curved so that the lower surface 29 of each fin 12 is coplanar with the lower surface 31 of the folded tongues 15. Thus, after resin molding, the lower surfaces 29 of fins 12 are adjacent the lower surface of the casing, and coplanar to the lower surfaces 31 of tongues 15.

The fins 12 can be formed to any desired shape as chosen by those skilled in the art, but should preferably include apertures 18, such as those shown in FIG. 2A, for ensuring a more satisfactory anchoring of the molding resin to the fins 12. The attainment of a good anchoring of the heat sink according to the invention in the resin is one of the problems that the present invention aims at solving. In the embodiment of FIG. 2A, a particularly satisfactory anchoring is ensured due to the fact that the folded tongues 15 do not contact each other so that two orthogonal channels 19 are created between them. During the molding step, some resin will flow into channels 19 and beneath the connecting arms 13, thus ensuring a satisfactory anchoring of the heat sink and a more even distribution of the resin between the volume existing near the upper side and the volume existing near the lower side of the casing.

According to an embodiment of the present invention illustrated in FIG. 2C, the support portion 2 of the lead frame, which supports the chip 1, overhangs the platform 10 in order to further enhance the anchoring of the resin. Additionally, the size of the platform 10 is formed to be larger than that of the chip 1 to ensure sufficient thermal dissipation from the chip toward the lower surface 31 of the tongues 15.

FIGS. 3A, 3B and 3C, and FIGS. 4A, 4B and 4C respectively correspond to FIGS. 2A, 2B and 2C, which represent a top view and cross-sectional views along lines 2B—2B and 2C—2C of a base, to illustrate alternative embodiments of the invention. In each of these drawings, same reference numbers designate similar elements.

In an alternative embodiment as illustrated in FIGS. 3A–3C, prior to folding each tongue 16, a window 21 is formed in the metallic sheet adjacent the folding line 33. When folded, an aperture 22 is subsequently formed in each tongue 15 as illustrated in FIGS. 3A and 3C. The apertures 22 allow the resin to penetrate beneath the platform 10 thereby improving the anchoring of the heat sink 25. In an alternative embodiment as illustrated in the lower right quarter of FIG. 3A, a radial aperture 22' is provided adjacent the fold line 33. In an alternative embodiment as illustrated in the lower left quarter of FIG. 3A, a radial aperture 22-1 is provided in the platform 11 with a larger aperture 22-2 provided in the corresponding tongue 15. The aperture can also be formed in various other shapes such as a cross.

Additionally, it should be noted that during the folding process where the rough tongues 16 form tongues 15, no particular steps should be taken to ensure a smooth surface along the radius of the fold line 33. Should this radius crack during the folding process, it would ensure better anchoring to the resin.

As shown in the embodiment of FIGS. 4A–4C, the rough tongue patterns 16 can be pre-cut to ensure that tongues 15 contact each other after they are folded. This increases the thermal dissipation surface. However, in this embodiment, it is preferred to precut the rough tongue pattern 16 so that, after folding, recesses 23 are formed below the platform 10, extending from the connecting arms 13, to again ensure the proper anchoring to the resin. The alternative embodiment of FIGS. 3A–3C can be advantageously combined with that of FIG. 4A–4C.

One advantage of the structure according to the invention is that the platform 10 has a two-sheet thickness that results in a substantially rigid surface that resists warping. This ensures a flat surface on which to mount the chip support 2 and provide good thermal contact. The fins 12, which can be formed with apertures 8, have a one-sheet thickness and therefore form flexible structures that follow the contraction of the resin, thereby minimizing internal stresses.

As previously indicated above, the heat sink 25 according to the invention readily lends itself to simple and inexpensive manufacturing processes since it can be fabricated by cutting and folding. It is preferred, as is conventional in the field of industrial manufacturing, that a plurality of heat sinks 25 be sequentially formed from a ribbon or an elongated plate of material, where heat sinks remain integral with the ribbon or plate until the final manufacturing steps. Thereafter, chemical, physical, thermal, electrothermal or physicochemical processes can be performed on the heat sinks while they are still grouped. If the heat sinks 25 are made of aluminum, anodic oxidation or any other treatment for increasing the surface roughness of the heat sinks can be performed, in order to enhance the anchoring thereof to the resin, to improve their appearance, to get rid of polluting products, and so on. The tongues 15 can be folded simply by a punching process to provide, as desired, a heat sink having its upper and lower surfaces plane and parallel one with respect to the other.

As it should be apparent to those skilled in the art, various modifications can be made to the above disclosed preferred embodiments, and more particularly for the shapes to be selected, namely the shape of the platforms 10, the shape of the folded tongues 15, and the shape and number of the fins 12. Similarly, although the implementation of the present invention is particularly advantageous when used with an aluminum structure, it can also be embodied in heat sinks made of other materials, such as copper.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A heat sink for use in a plastic semiconductor casing, the heat sink being formed from a sheet of metal having a plurality of cut-out sections that define a plurality of tongues extending from a central portion of the sheet, each tongue having at least one edge established by one of the plurality of cut-out sections, each of the plurality of tongues being folded along a corresponding fold line so that its at least one edge overlaps the central portion to form a platform having an upper surface for being in thermal contact with a semiconductor chip, and a lower surface arranged to be coplanar with a main surface of the casing, at least two of the fold lines being nonparallel relative to each other.

2. The heat sink as recited in claim 1, wherein the sheet of metal is square and has corners, each tongue being disposed at a corner of the sheet of metal and being folded along a fold line to form a square platform.

3. The heat sink as recited in claim 2, wherein the tongues do not contact each other.

4. The heat sink as recited in claim 3, wherein the tongues do not contact each other at least near the corners of the square platform so that at least a portion of the upper surface extends beyond the lower surface.

5. The heat sink as recited in claim 2, wherein the tongues have apertures near the fold lines.

6. The heat sink as recited in claim 1, further comprising:
 a plurality of fins coupled to the platform; and
 a plurality of connecting arms coupling the fins to the platform.

7. The heat sink as recited in claim 6, wherein each fin has a lower surface and the connecting arms are curved so that the lower surface of each fin is coplanar with the lower surface of the platform.

8. The heat sink as recited in claim 6, wherein the platform has a plurality of sides and the connecting arms extend from each side of the platform.

9. The heat sink as recited in claim 1, wherein the sheet of metal is a sheet of aluminum.

10. A heat sink for mounting a semiconductor chip in a semiconductor casing, the heat sink comprising:
 a platform including an upper portion and a lower portion, the upper portion having an upper surface for mounting a chip thereon, the lower portion having a recess therein for attaching the platform to the semiconductor casing, the platform being comprised of a sheet having a central portion and a plurality of tongues extending from the central portion, the upper portion including the central portion and the lower portion including the plurality of tongues disposed to overlap and to be substantially parallel to the central portion;
 at least one fin coupled to the platform; and
 at least one connecting arm coupling the at least one fin to the platform, the connecting arm having ends, one end of the arm being coupled to the platform and the other end being coupled to the fin.

11. The heat sink as recited in claim 10, wherein the sheet is square and has a plurality of corners, each of the plurality of tongues being disposed at a corner of the sheet.

12. The heat sink as recited in claim 10, wherein the recess in the lower portion is a channel defined by adjacent tongues that are laterally spaced from each other below the upper portion.

13. The heat sink as recited in claim 10, wherein the recess is a channel in the lower portion.

14. The heat sink as recited in claim 10, wherein the recess is disposed below the at least one connecting arm.

15. The heat sink as recited in claim 10, wherein the lower portion has at least one aperture.

16. The heat sink as recited in claim 10, wherein the fin includes at least one aperture.

17. The heat sink as recited in claim 10, wherein the fin and the platform each has a lower surface, the lower surface of the fin being substantially coplanar with the lower surface of the platform.

18. The heat sink as recited in claim 17, wherein the connecting arm is shaped so that the lower surface of the fin is substantially coplanar with the lower surface of the platform.

19. The heat sink as recited in claim 18, wherein the connecting arm is curved.

20. The heat sink as recited in claim 10, wherein the platform includes means for attaching the heat sink to the casing.

21. The heat sink as recited in claim 10, wherein the fin includes means for attaching the heat sink to the casing.

22. A heat sink for mounting a semiconductor chip in a semiconductor casing, the heat sink comprising:
 a sheet of metal including a central portion and a plurality of tongues extending from the central portion, each of the plurality of tongues being connected to the central portion at a corresponding one of a plurality of fold lines and being folded along its corresponding fold line to overlap the central portion, wherein at least two of the plurality of fold lines are nonparallel relative to each other, and wherein the central portion and the folded tongues establish a platform having an upper surface adapted to mount the semiconductor chip thereon and a lower surface to engage the semiconductor casing.

23. The heat sink as recited in claim 22, wherein the sheet of metal has a plurality of cut-out sections establishing the central portion and the plurality of tongues.

24. A semiconductor device comprising:
 a semiconductor chip;
 a semiconductor casing; and
 a heat sink including a platform having a first surface on which the semiconductor chip is mounted and a second surface that engages the semiconductor casing, the platform being formed from a sheet of metal having a plurality of cut-out sections that define a plurality of tongues extending from a central portion of the sheet, each of the plurality of tongues having at least one edge established by one of the plurality of cut-out sections, each of the plurality of tongues being folded so that its at least one edge overlaps the central portion to form the platform, at least one of the central portion and one of the plurality of tongues having an aperture extending therethrough, at least a portion of the aperture being disposed on the second surface with a portion of the semiconductor casing extending therethrough to anchor the platform to the casing.

25. The semiconductor device as recited in claim 24, wherein the semiconductor casing is made from a plastic material, the platform has a recess that receives the plastic material to anchor the platform to the casing, and the recess is disposed below the central portion of the platform.

26. The semiconductor device as recited in claim 25, wherein the heat sink further includes a plurality of fins coupled to the platform.

27. The semiconductor device as recited in claim 26, wherein at least one of the plurality of fins has an aperture through which the plastic material extends to anchor the fin to the semiconductor casing.

28. A semiconductor device comprising:
 a semiconductor chip;
 a semiconductor casing; and
 a heat sink including a platform comprising an upper portion and a lower portion, the upper portion having an upper surface on which the semiconductor chip is mounted, the lower portion having at least two intersecting recesses therein that receive a portion of the casing to attach the platform to the semiconductor casing, the platform being comprised of a sheet having a central portion and a plurality of tongues extending from the central portion, the upper portion including the central portion and the lower portion including the plurality of tongues disposed to overlap and to be substantially parallel to the central portion.

29. The semiconductor device as recited in claim 28, wherein the semiconductor casing is made from a plastic material, and the recess receives the plastic material to anchor the platform to the casing.

30. The semiconductor device as recited in claim 29, wherein the heat sink further includes a fin coupled to the platform.

31. The semiconductor device as recited in claim 30, wherein the fin has an aperture through which plastic material extends to anchor the fin to the semiconductor casing.

32. A heat sink for mounting a semiconductor chip in a semiconductor casing, the heat sink comprising:

a sheet of metal including a central portion and at least three individual tongues independently extending from the central portion, each of the tongues being connected to the central portion at a fold line and being folded along its fold line to overlap the central portion so that the central portion and the folded tongues establish a platform having an upper surface for mounting a semiconductor chip thereon and a lower surface to engage a semiconductor casing.

* * * * *